(12) United States Patent
Hofmann et al.

(10) Patent No.: US 10,647,915 B2
(45) Date of Patent: May 12, 2020

(54) CONVERTER FOR GENERATING A SECONDARY LIGHT FROM A PRIMARY LIGHT, LIGHT-EMITTING ELEMENTS WHICH CONTAINS SUCH A CONVERTER, AND METHOD FOR PRODUCING THE CONVERTER AND THE LIGHT-EMITTING ELEMENTS

(71) Applicant: FRAUNHOFER-GESELLSCHAFT ZUR FOERDERUNG DER ANGEWANDTEN FORSCHUNG E.V., Munich (DE)

(72) Inventors: Ulrich Hofmann, Itzehoe (DE); Hans-Joachim Quenzer, Itzehoe (DE); Thomas Lisec, Itzehoe (DE); Thomas Von Wantoch, Kiel (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 16/063,606

(22) PCT Filed: Dec. 13, 2016

(86) PCT No.: PCT/EP2016/080762
§ 371 (c)(1),
(2) Date: Jun. 18, 2018

(87) PCT Pub. No.: WO2017/102708
PCT Pub. Date: Jun. 22, 2017

(65) Prior Publication Data
US 2018/0371315 A1    Dec. 27, 2018

(30) Foreign Application Priority Data

Dec. 18, 2015  (DE) .......................... 10 2015 122 323
Apr. 13, 2016  (DE) .......................... 10 2016 106 841

(51) Int. Cl.
*C09K 11/08* (2006.01)
*G09F 13/00* (2006.01)
(Continued)

(52) U.S. Cl.
CPC ................ *C09K 11/08* (2013.01); *B81C 1/00* (2013.01); *C23C 16/45525* (2013.01);
(Continued)

(58) Field of Classification Search
None
See application file for complete search history.

(56) References Cited

U.S. PATENT DOCUMENTS 9,221,217 B2   12/2015  Lisec et al.
9,688,910 B2   6/2017   Eberhardt et al.
(Continued)

FOREIGN PATENT DOCUMENTS

DE   102013226630 A1   6/2015
DE   102013226650 A1   6/2015
(Continued)

OTHER PUBLICATIONS

Shani; "Fundamentals of planar remote phosphor LEDs"; p. 34-37; 2012; Issue 29; Luger Research e.U.
(Continued)

*Primary Examiner* — Ashok Patel
(74) *Attorney, Agent, or Firm* — Laurence A. Greenberg; Werner H. Stemer; Ralph E. Locher

(57) ABSTRACT

A converter assembly for converting a primary light into a secondary light includes at least one element which has a light-converting structure with open pores and which is laterally held by a frame. The surfaces of both the light-converting structure as well as of the inner face of the frame are covered with a transparent layer such that each of the afore-mentioned elements forms a region in which a prop- (Continued)

erty of the incident light and preferably of the wavelength thereof is changed. In specific embodiments, the converter assembly can be part of display assemblies or of miniaturized components for example. There is also described a method for producing the converter assembly.

29 Claims, 9 Drawing Sheets

(51) Int. Cl.
    *F21K 9/64*     (2016.01)
    *H01L 33/50*     (2010.01)
    *B81C 1/00*     (2006.01)
    *C23C 16/455*     (2006.01)
    *G02F 1/13357*     (2006.01)
    *C23C 16/04*     (2006.01)

(52) U.S. Cl.
    CPC ............... *F21K 9/64* (2016.08); *G09F 13/00* (2013.01); *H01L 33/50* (2013.01); *H01L 33/507* (2013.01); *B81C 2201/034* (2013.01); *C23C 16/045* (2013.01); *G02F 2001/133614* (2013.01)

(56) References Cited

U.S. PATENT DOCUMENTS

| | | | |
|---|---|---|---|
| 9,897,283 B2 | 2/2018 | Schwaiger et al. | |
| 10,043,954 B2* | 8/2018 | Iino | H01L 33/505 |
| 2006/0261360 A1 | 11/2006 | Takehashi et al. | |
| 2011/0044026 A1* | 2/2011 | Deeben | H01L 33/508 |
| | | | 362/84 |
| 2013/0016499 A1 | 1/2013 | Yee et al. | |
| 2014/0071683 A1 | 3/2014 | Hamada et al. | |
| 2014/0158982 A1 | 6/2014 | Park et al. | |
| 2015/0184830 A1 | 7/2015 | Nagao et al. | |
| 2015/0221623 A1* | 8/2015 | Tischler | H01L 25/165 |
| | | | 257/89 |
| 2017/0025586 A1* | 1/2017 | Watanabe | H01L 33/62 |

FOREIGN PATENT DOCUMENTS

| | | |
|---|---|---|
| WO | 2009136351 A1 | 11/2009 |
| WO | 2012104106 A1 | 8/2012 |
| WO | 2013183751 A1 | 12/2013 |

OTHER PUBLICATIONS

Nguyen T. Tran, et. al.; "Studies of phosphor concentration and thickness for phosphor-based white light-emitting-diodes", Journal Lightwave Technology; p. 3556-3559 No. 21, 2008; vol. 26; IEEE.
Nguyen T. Tran, et. al.; "Effect of phosphor particle size on luminous efficacy of phosphor-converted white LED", Journal Lightwave Technology; p. 5145-5150; 2009; vol. 27, No. 22; IEEE.
Matted Meneghini, et al.; "Thermally activated degradation of remote phosphors for application in LED lighting", Transaction on Device and Materials Reliability; 2013; p. 316-318; vol. 13, No. 1; IEEE.
Chun-Chin Tsai, et al.; "Ultra-high thermal-stable glass phosphor layer for phosphor-converted white lightemmiting diodes"; Journal of Display Technology; p. 427-432; 2013; vol. 9, No. 6.
Huihua Liu, et al.; "LED wafer level packaging with a remote phosphor cap"; Proc. EMAP; 2012; Lantau, Island; IEEE.
Liang Yang, et al.; "Preparation of phosphor glass via screen printing technology and packaged performance for LEDs"; 2013; 14th International Conference on Electronic Packaging Technology ; Dalian, China; IEEE.
Jeffrey C. C. Lo, et al.; "Multilayer dispensing of remote phosphor for LED wafer level packaging with pre-formed silicone lens"; 2014 Electronics Systems-Integration Conference; Helsinki, Finland; IEEE.
J. Hofmann, et al; "A novel vacuum-packaged low-power scanning mirror with inclined 3D-shaped window", Transducers'11; p. 1527-1530; 2011; Beijing, China; IEEE.
I. Aoyagi, et al.; "A raster-output 2D MEMS scanner with an 8×4 mm mirror for an automotive time-of-flight image sensor"; Transducers 2013; Barcelona, Spain; IEEE.
Veljko Milanovic, et al; "High brightness MEMS mirror based head-up display (HUD) modules with wireless data streaming capability"; Conference on MOEMS and Miniaturized Systems XIV; 2015; San Francisco, CA, USA.
Jonathan J. D. McKendry, et al; "Visible-light communications using a CMOS-controlled micro-light-emitting-diode array"; Journal of Lightwave Technology; p. 61-67; 2012; vol. 30, No. 1; IEEE.
Wing Cheung Chong, et al.; "1700 pixels per inch (PPI) passive-matrix micro-LED display powered by ASIC"; 2014.

* cited by examiner

CONVERTER FOR GENERATING A SECONDARY LIGHT FROM A PRIMARY LIGHT, LIGHT-EMITTING ELEMENTS WHICH CONTAINS SUCH A CONVERTER, AND METHOD FOR PRODUCING THE CONVERTER AND THE LIGHT-EMITTING ELEMENTS

BACKGROUND OF THE INVENTION

Field of the Invention

The present invention relates to converters ("converter arrangements") for the conversion of a primary light into a secondary light. The converters are characterised in that they have one or several, often a multitude, of bodies that convert incident or permeating primary light into secondary light. Depending on the arrangement, they can scatter this light or emit it directionally. Each body contains a porous, light-converting structure whose surfaces are covered with a transparent, preferably an inorganic, preferably an oxidic layer. Each body is surrounded by at least one frame which is also covered by the said transparent layer. The converter arrangements can have very different shapes. They can be, for example, a plurality of extremely small bodies (with dimensions down into the μm range) which are arranged in the form of arrays, wherein each body is separated from the adjacent body by the frame that surrounds it. In other embodiments, the bodies can be larger and can possess frames of any geometry. Arrays with a plurality of the said bodies can be combined with corresponding arrays of optical components, such as mirrors or lasers, to form lamps (light-emitting elements) having a larger emission area. Alternatively, the arrays can be separated, or converters can be produced with only one or a few light-converting bodies; individual bodies surrounded by frames or smaller arrays thereof can then be processed in microelectronic components. However, the invention is not limited to converter arrangements for microelectronics but rather also provides larger converter arrangements and corresponding light-emitting areas.

The converters in accordance with the invention can be integrated in the course of the production of silicon-based components, ICs and the like, since they can be embodied with the aid of etching, masking and deposition techniques that are customary in this field.

The so-called remote phosphor technology is becoming increasingly important for modern lighting systems. It is based on the fact that certain luminescent materials (phosphors) can convert incident light of a certain wavelength with high efficiency into light of another (longer) wavelength. By mixing different phosphors, a white light can be generated in this way. On the other hand, in combination with light sources such as semiconductor lasers, lighting systems with a very high intensity can be produced in an extremely small space. Due to scattering effects in the converter containing the phosphors, the secondary light is radiated comparatively uniformly over its surface, even if the primary light, as in the case of a laser, is sharply focused. An example of the latter is provided by the new laser activated remote phosphor (LARP) laser headlights of the BMW i8 which have a very high luminous density and which increase the maximum range of the high beam (1-lux limit) from 320 m (LED high beam) to 710 m. This is also advantageous for LEDs and LED-based light-emitting devices, as described in Shani, "Fundamentals of planar remote phosphor LEDs", Luger Research e.U., Issue 29, 2012. However, it would also be desirable to be able to limit the lateral scattering, as required, so as to obtain what are, as far as possible, point-form secondary light sources.

The coating of blue LEDs with layers containing phosphors to generate white light was introduced some time ago by Cree. Studies on the concentration of phosphors and their thickness for achieving white light have been reported by N. T. Tran et. al. in "Studies of phosphor concentration and thickness for phosphor-based white light-emitting diodes", J. Lightwave Technol., Vol. 26, No. 21, 2008. With the aid of a material that absorbs blue wavelengths and emits yellow (YAG:Ce) which is therefore well suited for the light conversion of blue-emitting Si-LEDs, phenomena such as the refractive index difference between phosphors and the surrounding matrix have been investigated, leading to scattering, capturing and absorption effects within the region in which the phosphor is located. These effects reduce the effectiveness of the phosphors. The theoretical studies have been simulated on the assumption that spherical phosphor particles were mixed with a matrix material having a refractive index of 1.46, and are filled in a cup-shaped space immediately above an LED chip.

However, the efficiency of the light conversion in converter layers applied directly onto the LED suffers significantly from the heat energy dissipated by the LED. In addition, there is the phenomenon of back-reflection on the surfaces of the phosphor applied in layer form. In order to reduce the heat input into the phosphor layer, the phosphor-containing converter layer is positioned at a certain distance from the LED in the remote phosphor configuration. The influence of the size of such phosphor particles on the quantity of emitted light and the conversion efficiency has also been investigated by N. T. Tran and colleagues (Tran et al., "Effect of phosphor particle size on luminous efficacy of phosphor-converted white LED", J. Lightwave Technol., Vol. 27, No. 22, 2009). These studies were performed both on devices in which the light-converting element was in direct contact with the LED, and also on remote phosphor constructs. With remote phosphor configurations, the reflection phenomena are also reduced, (Shani, see the above reference).

In most cases, the phosphors are mixed with organic materials such as, for example, silicone, and applied as a thick film by printing, dispensing or centrifugal coating onto a substrate. It is also possible to produce freestanding converters of any shape, for example, by injection moulding.

With increasing light output, however, ageing effects also occur in remote phosphor configurations. A major contributor to this is the poor thermal conductivity and low thermal stability of the organic materials used in converter production. A drastic degradation has been reported by M. Meneghini et al. in "Thermally activated degradation of remote phosphors for application in LED lighting", IEEE Transact. on Dev. and Mat. Reliability, Vol. 1, 2013, after storage at 150° C., for both the substrate plate of the converter, consisting of polycarbonate, and the silicone-based converter layer located on the latter. In "Ultra-high thermal-stable glass phosphor layer for phosphor-converted white light-emitting diodes", J. Display Technol., Vol. 6, 2013, C.-C. Tsai et. al. have been able to show that glass-based phosphor layers have a much higher thermal stability than silicone-based layers and exhibit no degradation, even after storage at 350° C. There is, however, a problem that even glass-based phosphors can degrade chemically or thermally on account of the high production temperatures. A solution to this problem is provided by DE 10 2013 226 630 A1. This document describes that glass-based converter layers or mouldings can be produced at temperatures of 350-400° C. using glasses with a special composition. Another advantage of using glass as a matrix material is that its refractive index can be matched to those of the phosphors (about 1.8) by adding appropriate elements. As a result, the light scattering is suppressed, thereby increasing the light output.

The main applications of the remote phosphor technology are in lighting systems based on LEDs. Comparatively large converters can, for example, be produced by injection moulding. For the production of small converter arrangements which in use can be applied onto a substrate with LEDs, H. Liu et al. in "LED wafer level packaging with a remote phosphor cap", Proc. EMAP, Lantau, Iceland, 2012, propose the pressing of a phosphor-silicone paste into an aluminum mould having a multiplicity of small depressions which have previously been sprayed with a release agent. After smoothing of the surface and hardening of the paste in a furnace, it was possible to obtain a correspondingly structured film. This is then mounted with high-viscosity silicone onto a cover wafer provided with apertures, which in turn is mounted on a base silicon wafer comprising pre-mounted LEDs.

For structured application, both in the use of phosphors in a glass matrix (L. Yang et al., "Preparation of phosphor glass via screen printing technology and packaged performance for LEDs", Proc. ICEPT, Dalian, China, 2013), and also in a silicone matrix (JCC Lo et al., "Multilayer dispensing of remote phosphor for LED wafer level packaging with pre-formed silicone lens", Proc. ESTC, Helsinki, Finland, 2014), pastes can be used which can be applied with techniques such as screen printing, moulding or dispensing. Moulding and dispensing are more suitable for low-viscosity solutions on an organic base. High-viscosity solutions or pastes, such as, for example, glass-based phosphors can be applied well by means of screen-printing. Typical dimensions of converter arrangements generated in this way are >100 μm.

Intelligent lighting systems are becoming increasingly important for applications such as, for example, image projectors or adaptive headlights. Many developments are based on micro-mirrors that reflect the light of an external source in a modulated manner. These can be individual scanner mirrors with a sufficiently large deflection in the x-and y-directions and a sufficiently high scanning frequency. Thus, U. Hofmann et. al. describe a respective component developed for display arrangements in "A novel vacuum-packaged low-power scanning mirror with inclined 3D-shaped window", Proc. Transducers, Beijing, China, 2011. A scanner specifically for adaptive headlights is described in T. Aoyagi et. al. "A raster-output 2D MEMS scanner with an 8×4 mm mirror for an automotive time-of-flight image sensor", Proc. Transducers, Barcelona, Spain, 2013. Another option is to use an array consisting of very small mirrors, which are tilted backwards and forwards between two positions. An example of this is provided by the DLP technology of Texas Instruments, based on approximately 10×10 μm² aluminum micro-mirrors. As of now, DLP chips with up to 2560×1600 individual elements are commercially available.

In the article by V. Milanović et al. "High brightness MEMS mirror-based head-up display (HUD) modules with wireless data streaming capability" Proc. SPIE Conf. MOEMS and Miniaturized Systems XIV of San Francisco, Calif., 2015, the use of a phosphor-based converter in combination with a MEMS micro-mirror for a head-up display is reported. Therein, the modulated light beam of a single laser source is first projected onto the converter plate and only then is the secondary light projected via a folding mirror onto the actual projection surface (the windscreen of a vehicle). The disadvantage is that the image loses its sharpness as a result of the light scattering in the phosphor applied over the entire surface.

A better result can be achieved if the converter plate is provided with an arrangement of separate dots of luminescent material (image points, pixels), as disclosed in DE 10 2013 226 650 A1. In this document the use of MEMS mirrors for the modulation of the primary light (laser beam) is envisaged, in combination with a converter plate with separate pixels. Methods for the production of the converter pixels are not discussed.

SUMMARY OF THE INVENTION

The object of the present invention is to provide converters comprising light-converting material for the conversion of a primary light into a secondary light, which are suitable for the so-called remote phosphor technology and which scatter incident light to the desired extent. When the converter arrays have several or a multitude of individual light-converting regions in a small space and possibly of very small sizes (for example, with dimensions in the μm-range), it is intended that these regions are aligned with respect to each other such that, without additional measures, they have no direct optical contact with each other, and thus any lateral "cross-talk" is excluded. In their basic form it should preferably be possible for the converters to be produced with purely inorganic materials, but, if necessary, they should be able to co-operate with organic materials at material interfaces. They should preferably be producible in a temperature range, that is to say, they should be able to withstand temperatures which enable applications in traditional microelectronic micro-optics, such as in silicon-based chips or ICs.

In solving the object, the inventors provide converters for the conversion of a primary light into a secondary light. Each converter arrangement comprises at least one body which has a light-converting structure with open pores and is held laterally by a frame, wherein the surfaces of both the light-converting structure and the internal sides of the frame are covered with a transparent layer, preferably an inorganic layer of a metal compound. The covering is normally complete.

The term "light-converting structure with open pores" is intended to express the fact that the light-converting structure as such is not present as a monolith but has open pores. However, this does not necessarily mean that the pores present in the light-converting structure must be "empty", that is to say, filled with gas or evacuated. Instead, they can be partially or completely filled with another material, as is explained in more detail below.

BRIEF DESCRIPTION OF THE SEVERAL VIEWS OF THE DRAWING

The invention is described in more detail below, inter alia with the aid of figures, which show the following:

FIG. 8c shows an arrangement with micro-lenses arranged on both sides.

DESCRIPTION OF THE INVENTION

Figure 1A:
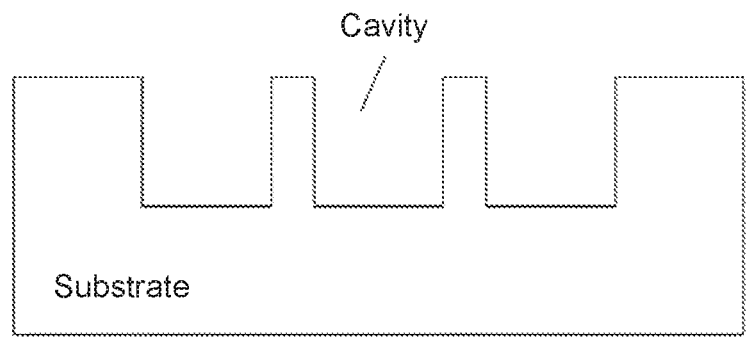
FIG. 1 illustrates schematically a possible production of converters (substrate-supported) according to the present invention.

Due to its porous structure, the converter arrangement of the invention has a plurality of internal curved surfaces on which the incoming light and also the light that has already been converted are scattered. The transparent inorganic layer of a metal compound ensures good corrosion protection of the light-converting material, which is of particular importance due to the large internal surfaces of the bodies, which are usually in contact with the surrounding atmosphere.

The number of bodies in a converter arrangement can vary widely and on occasions can be very high. In any case, each body is laterally surrounded by a frame which, on its inner faces, i.e. facing towards the body, is also covered by the said transparent layer. Optionally, the body, or each of the bodies (or even only a part of the bodies) can also rest on a substrate and be supported by the latter, which also forms the frame structure(s). A single converter arrangement can, in a first embodiment, have a multiplicity of extremely small such bodies (with dimensions down into the µm-range) which are arranged in the form of arrays, wherein each body is separated from the adjacent body by the frame surrounding it. In other embodiments, the bodies can be larger and can possess frames of any geometry.

Each of the said bodies is normally permeated throughout with pores, wherein the pores usually vary in shape and size. In general, the shape and size of the pores are determined by the shape and size of the particles used in the production. Since the particles are usually not identical, the shape and size of the pores within a body are randomly distributed about a statistical mean. However, a gradient can be adjusted in the direction of the free surface, for example, in the case of sedimentation of the particles from a solution.

The frame normally has a flat lower face and upper face; the volume that it encloses can be completely or partially filled with the body. Its geometry and the filling level are selected as required. The individual bodies can possess a high structural depth, and/or the frames can be completely filled with the bodies.

Each body of the converter arrangement forms a region in which a property of the incident light, preferably its wavelength, is altered. Preferably, the individual regions of the converter arrangement are adapted to the structure of the building or lighting element, for which it is provided. For example, in the case of a component with very small primary light sources, such as lasers or micro-mirrors, the surface of the regions will be adapted to the surface of the primary light sources (e.g. lasers or micro-mirrors). This surface can be square, rectangular, round, or any other arbitrary shape, and can have dimensions of for example, approx. 10×10 µm, or even less. Needless to say, the dimensions can also be larger, for example up to 100×100 µm and more; increasingly, however, corresponding construction or lighting elements are rather designed with even smaller light sources so that the regions will often occupy surface areas of approx. 50×50 µm and below. The depth of the regions can be substantially greater than their length and/or width and can, for example, be around 100-1000 µm. However, this is by no means mandatory. The regions can also be designed to be rather flat, i.e., the depth can be less than their length and/or width, if this is advantageous for a higher effect. The regions of a converter arrangement often have identical dimensions. However, this does not have to be the case; an alternative embodiment will be described further below.

The material of the porous body with light-converting properties is selected depending as required. It is preferably a luminescent material which is referred to below also as a phosphor. Its composition can be freely selected. For the generation of white light from blue-emitting Si LEDs, the YAG:Ce materials investigated by N. T. Tran (see the above reference) can be used. However, this is only an example, the person skilled in the art is familiar with a multitude of light-converting materials which in principle can also be envisaged for the invention. Thus, for lighting and display applications, in addition to the yellow phosphors, the red (e.g., $CaAlSiN_3:Eu^{2+}$, CASN), blue (e.g., $Sr_3MgSi_2O_8:Eu^{2+}$, SMS), and green (e.g., $Ba_2SiO_4:Eu^{2+}$, BSO) phosphors are also of interest. In principle, all phosphors that are commercially available and applicable can be used. However, particles of glasses or other matrix materials which contain chemically or physically homogeneously distributed luminescent compounds, compound clusters, or nano-particles, can also be used to produce the porous bodies. In yet another embodiment, the surfaces of the bodies, i.e., also the pores contained in the interior of the bodies, can be coated with luminescent material. The material having light-converting properties is preferably a purely inorganic material but can in rare cases also comprise organic components.

The converter arrangements of the present invention can, in a first embodiment of the related manufacturing process, be produced with the aid of particles that have been loosely filled into the respective frames; and have then been bonded to the transparent layer of inorganic material. The particles are preferably constructed of purely inorganic material; however, since the interconnection of the particles with one another, described in more detail below, can be generated at relatively moderate temperatures (maximum 400° C., in some cases only up to 150° C. or even 60° C., for example, in the case of the deposition of $Al_2O_3$ using ALD), it is also possible to use organic materials if these withstand the above temperatures without decomposition or appreciable ageing.

The particles can consist of a single material, but a mixture of particles of different materials can also be used. If particle mixtures of two or more types of particles are used, both or all of the particle types can consist of a light-converting material, for example in order to obtain secondary light of a specific colour. Alternatively or cumulatively, it can be advantageous to mix light-converting particles with particles of a material that is not intended directly for light conversion but which, overall, brings about an improvement of the converter properties, for example, by optimizing light scattering and light absorption. Since, as mentioned above, the light-converting particles themselves also reabsorb the secondary light, their concentration has an influence on the converter efficiency, as described by N. T. Tran (see the above reference). Thus, in one embodiment of the invention, light-converting particles are mixed ("diluted") with particles that consist of an optically transparent, but not light-converting, material with a prescribed refractive index. In principle, a further type of optically transparent, but not light-converting, particles can also be admixed; these have a refractive index deviating from the first two types of particle and serve as scattering centres for an optimum scattering of the primary light within the converter structure. Mostly, however, the addition of scattering centres is not required since the presence of air-filled pores between the particles provides sufficient light scattering. On the contrary, it can be necessary to suppress the light scattering within the porous converter structures. This can be achieved, for example, by applying an anti-reflection layer which also covers the entire inner surface of the porous converter structure. As with the production of the porous structures this can take place, for example, by means of ALD.

The size of the particles is not critical but affects the converter efficiency. The diffuse radiation and the emission radiation of the particles are not necessarily identical. Radiated light is absorbed (by the walls of the converter, by the light-converting particles and, if applicable, by the "diluting" particles). N. T. Tran et al., in their article in the Journal of Lightwave Technology (see the above reference), have examined the behaviour of particles with diameters between 0.05 and 50 µm in two specific geometrical environments. The particles were located in a matrix whose refractive index differed by 0.34 from that of the particles. The light output increased from a diameter of approx. 0.5 µm to a maximum at approx. 20 µm and then decreased again. But other effects also play a role. The invention is not limited to particle diameters as described by N. T. Tran et al.; however, it has been found that converters with beneficial properties are obtained when the particles have size ranges between approx. 1 and 100 µm, preferably between approx. 5 and 50 µm, and more preferably between approx. 8 and 30 µm diameter (average value). It is beneficial if the particles have a round, or approximately spherical, or rounded-elongated (ovoidal) form. This is not a necessary criterion, but it promotes the formation of a uniform pore structure. Also, in very small converter regions care should be taken that more than one and preferably at least 10 particles can lie next to each other, although this number can of course be much larger. In other words, the size of the particles used should be adjusted to the size of the converter regions.

The particles can have been introduced into the regions of the converter structure in any manner, for example, by trickling, application with a doctor blade of the dry material or a slurry, or by dispensing a suspension or a slurry, wherein any suspension agent or other liquids possibly contained are subsequently evaporated before the solidification process is carried out.

The bodies of the converter arrangements according to the invention need not necessarily be constructed of particles. Alternatively, it is possible to use porous light-converting materials that can be produced in other ways. If light-converting materials based on glass, or in a glass matrix, are used, known techniques for the production of glass frit or porous glasses can, for example, be used, such as the Vycor glass process (a process in which phase-separated alkali borate glasses are made porous by the extraction of a soluble phase).

The light-converting bodies of the converter structures according to the invention are covered in the individual regions with a transparent layer, preferably an inorganic layer. Even if the body has been made with the aid of particles in powder form, these do not lie loose or moveably next to each other. The strength of the bonding of the particles with one another, if these served as the primary material, caused by the layer is so great that the bodies as a whole can be taken out of the regions, and can, for example, be held with tweezers without breaking apart. The bonding of the particles, if these served as the primary material, is therefore stable under normal conditions (i.e., without the application of external forces) and also withstands light mechanical impacts.

The material of the transparent layer is preferably free of organic constituents. More preferably, the layer consists of a metal compound, preferably a metal oxide; it can, however, also be a metal nitride, or a metal carbide, or a combination (e.g., an oxynitride or a carbonitride) of the above-cited materials or the like. As required, this material can be selected oxides having a lower refractive index such as, for example, aluminum oxide or silicon oxide, or from higher refractive index oxides, such as titanium dioxide or zirconium oxide, so as to adjust suitable reflectivity properties. As already mentioned, it can be necessary to suppress the light scattering at the transitions between particles and air-filled pores within the porous converter structures by means of an anti-reflection coating. This can consist of a single layer or a layer sequence.

The deposition of the transparent inorganic layer is preferably carried out by means of a chemical vapour deposition method (CVD). In particular, deposition by ALD (atomic layer deposition) has proved to be beneficial. In this method, two different components are successively introduced in the gaseous state into the reaction chamber. After the first component has accumulated in a monomolecular layer on the surface of the particles and the reaction chamber has been pumped out, the introduction of the second component causes a reaction with the first component that has been absorbed onto the surface and the formation of a layer that is only a few angstroms thick. The repetition of this procedure many times produces a particularly uniform layer. The layer thickness is primarily set by the number of coating operations. Therefore, layer combinations of different materials can easily be implemented. If ALD is used to produce the layer, layer thicknesses of only 5 nm are sufficient in some cases to achieve a mechanically stable solidification when light-converting particles have been used as the primary material for the body. Layer thicknesses of at least 10 nm or more are beneficial, for example in the range from 50 to 100 nm. Theoretically, however, there is no upper limit to the layer thickness; if required, the layer can become so thick that the pores within the body shrink to half their original volume or even less, or are even completely filled with the layer material. With the latter measure, the scattering effect of the converter arrangement in accordance with the invention can be influenced in a targeted manner.

The advantage of producing the bodies with the aid of particles is that loose particles of light-converting material or suitable particle mixtures can easily be filled into a plurality of depressions/moulds or cavities of a substrate and can there be solidified. The corresponding technique known from WO 2012/104106 A1. The substrate can be pre-treated prior to filling or can subsequently be chemically or mechanically processed and be combined with other components of a later component; this will be explained in more detail below for a variety of possible embodiments.

The respective process steps for the inventive method for production of the converter(s) according to the invention are shown schematically in FIG. 1: In accordance with step (a), an array of cavities corresponding to the dimensions of the converter arrangement is provided or formed in a substrate. This can take place, for example, by the dry etching of an Si-substrate using a resist mask. In the next step (step (b)), the cavities are filled with loose light-converting particles. In step (c), the loose light-converting phosphor particles are then solidified into solid, porous structures. The transparent, mechanically stable layer coats all light-converting phosphor particles that are located in each individual cavity.

With the method of WO 2012/104106 A1, it is possible to coat even particles of µm-size down to the floor of a cavity several 100 µm deep completely with a homogeneous layer. Thus, for example, a porous structure of monodisperse, spherical, or approximately spherical particles of approx. 10 µm diameter can be generated with this method. For solidification, a layer of a suitable material, for example an oxide such as $Al_2O_3$, can be deposited with a thickness of only 75 nm at 300° C., for example by means of ALD. The inventors could show with the aid of suitable experiments, e.g. with a cavity having a surface area of 1200×1200 µm and a depth of about 400 µm, that even if the thickness of the ALD layer is only approx. 1% of the particle diameter, the particles, even when subjected to shock (when dropped), are not released from the cavity. They could also show that the ALD layer covers all surfaces of the particles since the body only possesses open pores. The said layer bonds the particles firmly and mechanically stably at those points where they abut against one another.

The freestanding porous structures are surprisingly solid. Handling with conventional tweezers is possible.

The support material of the support structures according to the invention is selected as required. Since silicon is readily etchable and suitable for wafer and chip production, the support can consist of silicon. However, other support materials are also possible, provided that they withstand the coating temperatures of a maximum of about 400° C., preferably 250° C. or even only 60° C., as described above, without suffering damage disadvantageous for the later product.

As mentioned, both the particles and the support material are normally selected from purely inorganic materials, although this is not mandatory in all cases. The coating of the particles is also inorganic; it often consists of an oxide, nitride or an oxynitride of aluminum or another metal.

The pores between the particles can remain essentially free (they are then filled with the gas atmosphere that prevails in the converter or in the component that contains the converter, optionally at pressures other than ambient pressures, for example a reduced pressure): if, as described above, the thickness of the coating is only approx. 1% of the diameter of the particles, the pore volume is hardly reduced by the coating process. However, if required, such a reduction can be accomplished either by making the coating substantially thicker as described above. Alternatively, the pore volume can be subsequently filled with another material and/or using another method. Organic materials are not excluded to this end.

Figure 2:
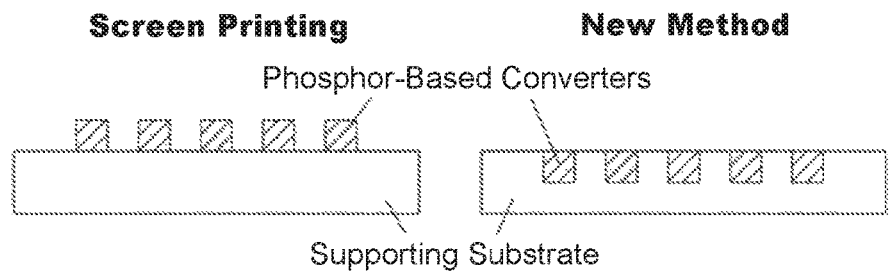
FIG. 2 shows on the left-hand side a screen-printed converter without a frame around the individual light-converting regions, and on the right-hand side a converter according to the present invention in which each region is surrounded by at least one frame.

The converter arrangements according to the invention have, inter alia, the following advantages:
  Insofar as they are free of organic materials, they can be exposed to significantly higher temperatures in further processing stages, if the materials responsible for the light conversion allow this.
  The production temperature of the converter arrangement is comparatively low when produced in accordance with WO 2012/104106 A1, so that even thermally sensitive light-converting materials do not degrade. ALD depositions typically take place at temperatures of between 100° C. and 300° C. For the production of conventional "remote phosphor" arrangements of glass-based phosphors, however, temperatures above 400° C., often even above 600° C., are in any event required so as to fuse a mixture of phosphor and glass particles into a uniform mass. In accordance with the invention, processing steps such as melting processes can be dispensed with in the production process of the converter arrangements if the light-converting structure with open pores is generated, for example, by the "adhering" of (e.g., sintered) particles using CVD methods such as ALD. When using the above-cited method, there are also no shrinkage effects.
  Individual converter regions with lateral dimensions well below 100 µm can be produced. At the same time their depth (height) can be several 100 µm
  The individual "converter pixels" (referred to above as "regions") are embedded in a substrate material, so that, in contrast to screen-printed arrays, the lateral cross-talk between adjacent pixels is reduced if the substrate material itself is not transparent, or is appropriately coated. A comparison of the converter arrays in accordance with the invention with screen-printed arrays is shown in FIG. 2.
  In particular small converter arrangements can be effectively cooled when the substrate consists of a good heat conducting material such as a metal, silicon, or a ceramic. Their thermal conductivity is orders of magnitude higher than that of silicone, plastics, or glass.
  By means of the coating on all faces with the transparent, inorganic layer, the light-converting particles are protected from corrosion.

In a specific embodiment of the invention, the layer that bonds the light-converting particles is used as an anti-reflection layer. This can be implemented, for example, with oxidic materials such as $TiO_2$, $SiO_2$ or $Al_2O_3$, which are known to have anti-reflection properties in thin layer form. These layers are preferably deposited by means of ALD since in this way all the internal surfaces of the porous structures can be coated, and very well defined layer thicknesses can be achieved. In this way, losses within the converter arrangement can be minimised without having to fill the spaces between the phosphor particles with a material having an adapted refractive index.

In an alternative embodiment of the invention, the pores within the individual regions of the converter structure are filled with an organic filler after the deposition of the bonding layer. In addition, the surface of one or a plurality of, or all bodies, or the entire converter structure, can be provided with a single-layer or multi-layer coating. By means of such measures, the mechanical stability, in particular with respect to thermo-mechanical stresses, for example in the event of temperature change stress, can on the one hand be improved. On the other hand, condensation of water within the porous particle matrix, which is possible under certain circumstances, can be prevented (hydrophobisation). The good heat conduction within the particle composite structure is not affected by this. The filling of the pores with an organic filler, e.g. an epoxy resin, silicone or polyimide, can at the same time also help to avoid optical losses at the interfaces. Together with the coating of the particles with an anti-reflection layer, higher light outputs can thereby be achieved.

Figure 3A:
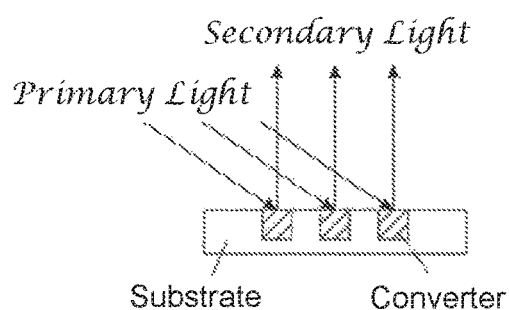
FIG. 3 shows the possibilities for the coupling of primary light into a converter arrangement according to the present invention.
Figure 3B:
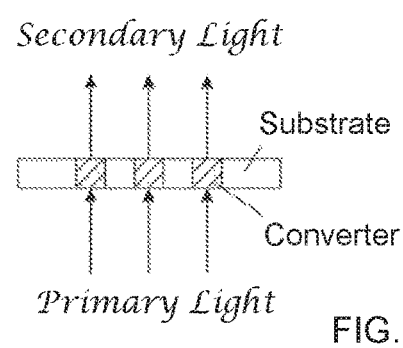

There are various options for the coupling of the primary light into individual converter regions according to the invention, or into arrays of such regions, and for coupling-out of the generated secondary light. FIG. 3 shows two of these options. For the embodiment of FIG. 3a, the light-converting particles have been filled into prefabricated, e.g. pre-etched, depressions of a supporting structure, here a substrate, and have then been solidified by the application of the coating as described above. This embodiment is more advantageous with respect to the cooling of the converter compared to the embodiment in FIG. 3b, provided the substrate consists of a good heat-conducting material. In the embodiment of FIG. 3b, the substrate beneath the converter arrangements has been removed, for example by etching or grinding, so that the primary light can be coupled in from beneath. By this means new possibilities arise with regard to the arrangement of the optical components of a lighting system; these are described in more detail in the following.

Figure 4A:
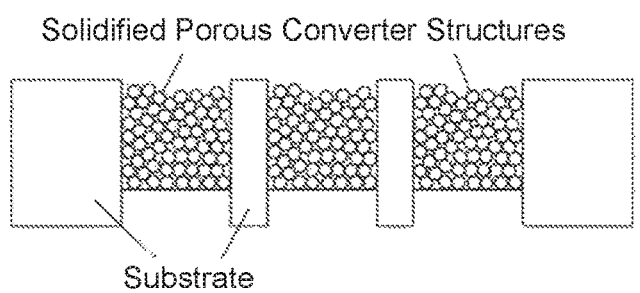
FIG. 4 shows a converter in accordance with the invention, in which the substrate beneath the porous light-converting bodies has been removed, FIGS. 5a-e and 5c'-e' illustrate schematically a possible production of converters according to the invention, whose frames are laterally metallised so as to improve the reflection, in one case with, and in one case without, an aperture stop.
Figure 4B:
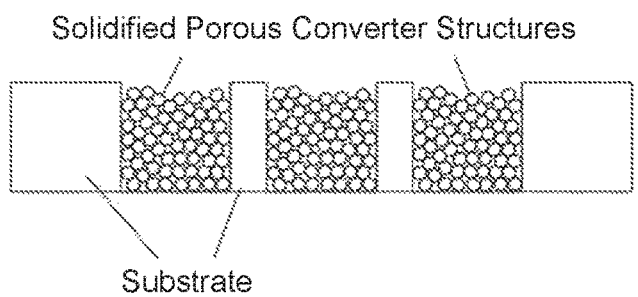

As mentioned above, the removal of the substrate from beneath the converter arrangements can take place in various ways. In the embodiment of FIG. 4a, the substrate thickness has remained unaltered in the areas surrounding and supporting the converter regions; however, the substrate has been removed below the regions. In the case of an Si substrate, this can take place from the rear face, e.g., by means of dry etching using a resist mask. In FIG. 4b the original substrate has been removed from the entire bottom surface; in the case of Si substrates, this can take place, e.g., by means of grinding and polishing. Variant (b) is slightly simpler since no additional resist mask is required on the rear face of the substrate. However, a disadvantage is that under certain circumstances the transparent inorganic layer on the outermost surface of the body containing the light-converting structures can be damaged. An essential advantage of the variant in FIG. 4a is the better cooling of the converter arrangement, provided the substrate has good thermal conductivity. A combination of both variants is also conceivable.

If light can be coupled at least partially on the rear face into the particle-regions of the converter arrangement according to the invention, an illumination "from beneath", that is to say, from the rear face relative to the emission direction, is possible.

Figure 10:
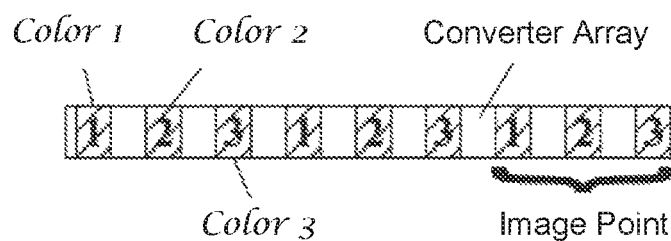
FIG. 10 shows a converter arrangement that is analogous to the screen of a television consisting of an array of groups (pixels), each having three light-converting regions with different light-converting properties.

In a further embodiment that can be combined with all of the previously described embodiments of the invention, the sidewalls and, if required, also the floors of the cavities generated in the substrate, can be provided with a reflective metallic layer in order to improve the light output. To this end, a metal, for example, aluminum or silver, can be sputtered or vapour-deposited before introducing the light-converting particles. By this means the cavity is completely lined. If required, the metal layer thus produced can be removed again by a subsequent isotropic dry etching process on the entire surface of all the lateral faces, i.e. from the floor of the cavity and the substrate surface. This can be beneficial if the rear face of the substrate is subsequently removed to allow coupling of the primary light from beneath, as described above. This embodiment can be implemented with different support materials; it is particularly beneficial if silicon is used as the support material. FIGS. 5a-e show the individual steps with which such a converter arrangement according to the invention, enabling a rear face irradiation of the primary light, can be produced. It should be understood, however, that steps (c) and (e) can be omitted to produce a converter arrangement similar to that shown in (d) but in which the floor of the substrate remains covered with a metallic mirror layer so as to improve the reflection of the primary light irradiated from the front face (see FIG. 10a). In detail, the sections of FIG. 5 show: the production of a cavity or an array of cavities corresponding to the dimensions of the converter arrangement (FIG. 5a), the application of a metal layer covering the substrate surface and lining the cavities completely, or nearly completely (FIG. 5b), the application of a mask (e.g. a resist mask) for the selective etching of openings in the metal layer on the floor of the cavities, e.g. by an anisotropic dry etching process (FIG. 5c), the filling of the cavities with loose light-converting particles and the solidification of the particles into solid, porous structures by deposition of a layer by means of CVD, in particular by means of atomic layer deposition (FIG. 5d), and the removal of the substrate beneath the converter arrangements so as to expose the bottom face of the converters (floor of the cavity) (FIG. 5e).

Figure 5A:
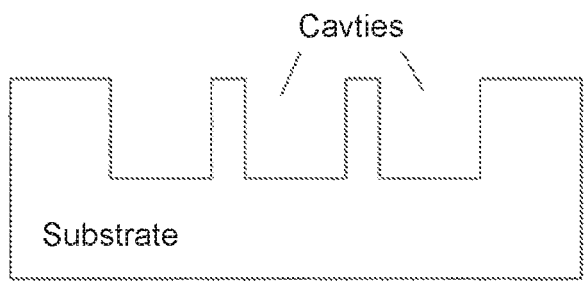
Figure 5B:
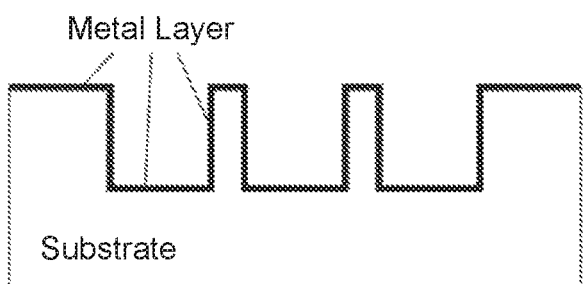
Figure 5C:
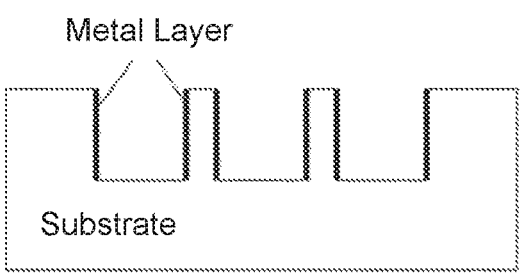
Figure 5D:
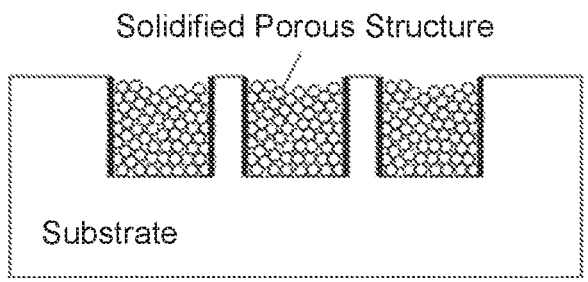
Figure 5E:
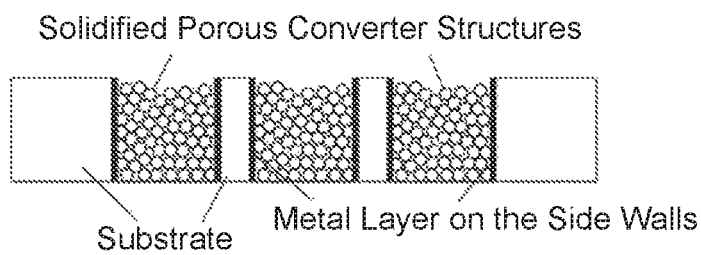
Figure 5C:
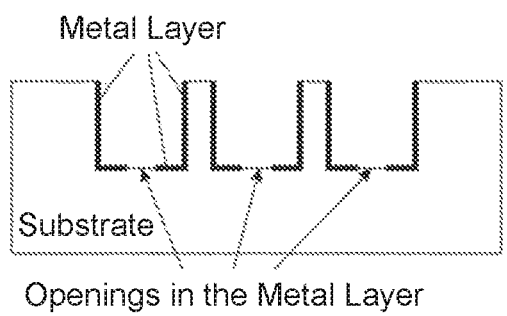
Figure 5D:
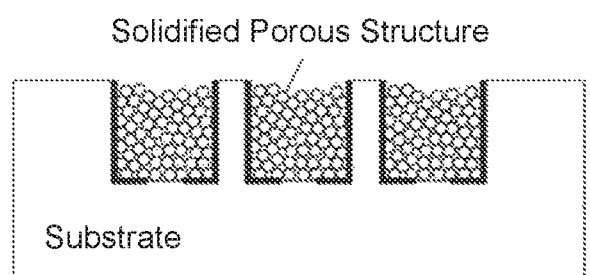
Figure 5E:
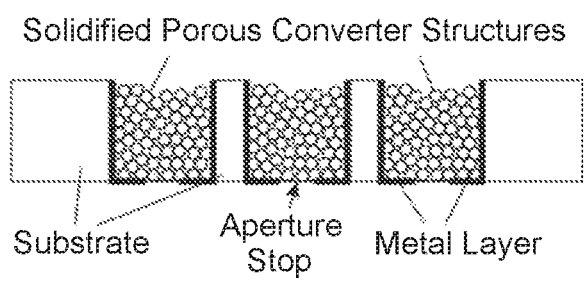

If additional masking (resist mask) is applied to the substrate after the application of the metal layer in accordance with FIG. 5b, the metal layer can be structured on the floor of the cavity before the introduction of the phosphor particles, without the metal having to be removed from the entire surface of all the lateral surfaces. In this way it is possible, for example, to implement an aperture stop in the metal. This is shown in FIGS. 5c'-e' which, starting from a substrate with metal-lined cavities, as shown in FIG. 5b, schematically depict the further process sequence. In detail, sections c' to e' of FIG. 5 show: the application of a mask (e.g., a resist mask) so as selectively to etch openings in the metal layer on the floor of the cavity, e.g. by an anisotropic dry etching process (FIG. 5c'), the filling of the cavity or cavities with loose light-converting particles and the solidification of these particles into solid, porous structures by the deposition of a layer by means of CVD, preferably by atomic layer deposition (ALD) (FIG. 5d'), and the removal of the substrate beneath the converter arrangement so as to expose the rear face of the converter regions (floor of the cavity) (FIG. 5e').

Converter arrangements with very small circular aperture stops (pinholes) can, for example, serve as point light sources. However, the aperture stops can also have any other shape.

Aperture stops can, of course, also be generated in the substrate material. To this end, cavities can, for example, firstly be generated in a substrate, these can be filled with light-converting particles and the latter can be solidified into a porous structure as described above, as shown in FIGS. 1a-c. The substrate is then partially removed from the direction of the rear face so that the regions filled with the porous structure are located on just a thin substrate with a defined residual thickness. Finally, aperture stops (pinholes) in the remaining substrate material are opened from beneath. In the case of silicon or metals this can take place, for example, by dry etching using a resist mask.

Figure 6A:
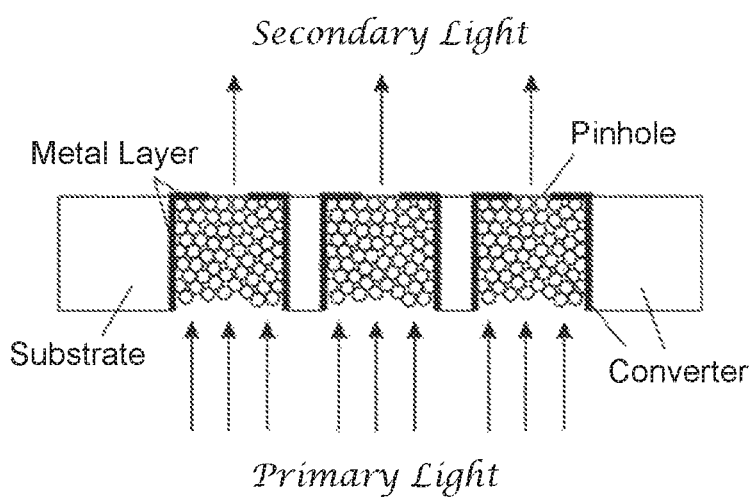
FIG. 6 shows two possible converter arrangements with aperture stops ("pinholes"), which can serve as miniaturised point light sources, In FIG. 7 two converter arrangements with inclined side faces are shown, in FIG. 14a with pinholes and metallisation on the insides of the cavities, and in FIG. 14b only with metallised side faces.
Figure 6B:
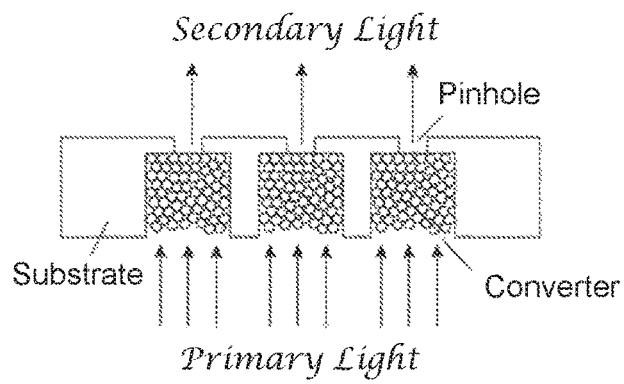

FIG. 6 summarises the two possibilities for the production of aperture stops. FIG. 6a corresponds to an inverted (upside down) version of the structure in FIG. 5e, with aperture stops in the metal layer that was originally deposited and structured on the floor of the substrate. Here the substrate has subsequently been removed. FIG. 6b shows a structure with aperture stops in the substrate. This variant offers the advantage of improved cooling of the converter arrangement since more support material remains around the individual converter regions because the substrate is not completely removed on the floor side of the converter regions. Needless to say, the two variants can be combined with one another. In this case, however, after the etching of the aperture stop in the substrate material in accordance with FIG. 6b, the metal with which the cavity was lined before the introduction of the light-converting particles has to be opened (if this was not already done before the particles were introduced). Depending on the metal, various dry and wet chemical etching processes are available for this purpose.

Figure 7A:
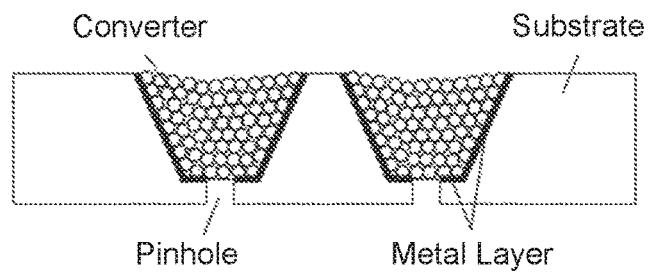
Figure 7B:
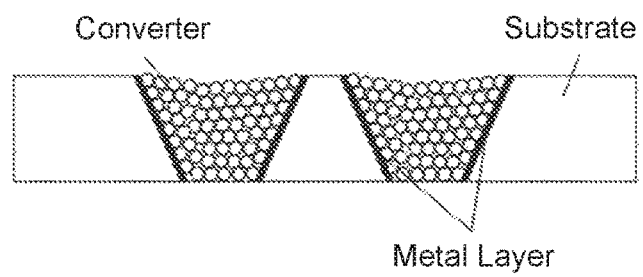

In order to improve the coupling-out of the secondary light, the converter structures can also have inclined side faces, see FIGS. 7a-b. To this ent, in the course of producing the cavities in the substrate, which is often done by etching, the inclination can be adjusted accordingly. Step (a) of the method described above in connection with FIG. 5 is modified accordingly. If a silicon substrate is used, in addition to the dry etching processes that are known to the person skilled in the art, anisotropic etching in aqueous KOH or aqueous tetramethylammonium hydroxide solution (TMAH solution) can also be used. This results in rectangular cavities with an inclination angle of the side faces of 54°. In particular, etching in KOH solution, in comparison to dry etching, results in significantly smoother side faces which improves their reflection characteristics. If the converter according to the invention is produced using this method, however, a particularly close arrangement of the regions relative to each other must be avoided since the density of wet-chemically etched converter pixels is always lower due to the inclined side faces. Converter regions with inclined side faces can be formed in the same configurations as described above for the regions with straight sides, i.e., they may or may not have a reflective metal lining, they may or may not be opened at the floor-side for the irradiation of primary light, and said openings may be in the form of "pinholes" for the irradiation of primary light, or as aperture stops, as described above in the various variants. FIG. 7a shows an embodiment with "pinholes" and metallisation on the inner faces of the cavities. FIG. 7b shows an embodiment in which only the side faces are metallised.

Figure 8A:
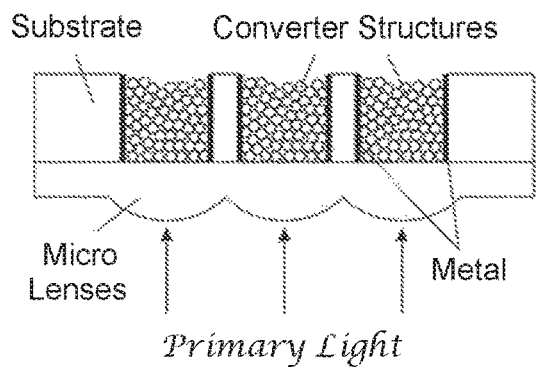
FIGS. 8a to c show converter arrangements with micro-lenses for focussing and/or collimating the primary light (FIG. 8a) or the secondary light (FIG. 8b).
Figure 8B:
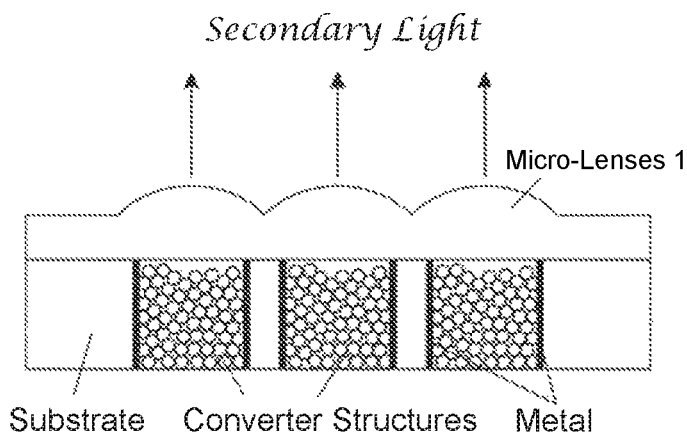
Figure 8C:
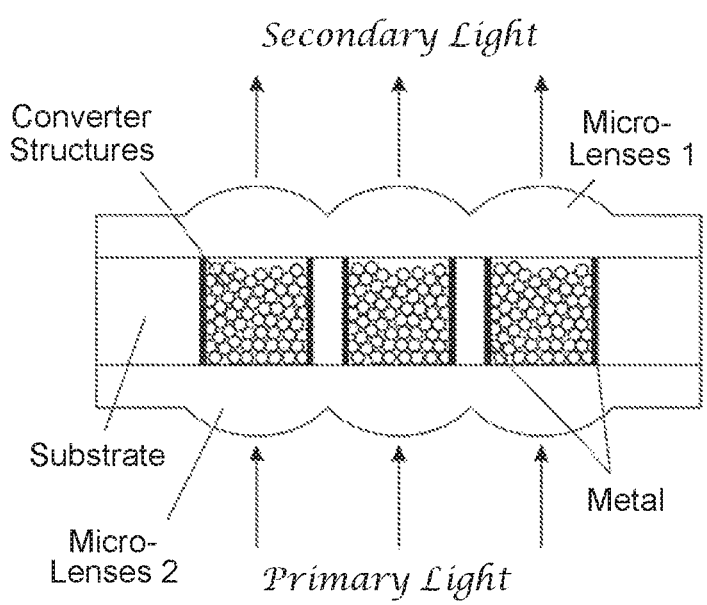

In a specific embodiment of the invention the converter arrangement is combined with a device for focusing or collimation, for example, with micro-lenses (curved interfaces to the adjacent medium), in order to focus the incident primary light or the emitted secondary light. Three possible variants of this embodiment are shown in FIGS. 8a-c. FIG. 8a shows an embodiment with focusing/collimation of the primary light by means of a lens structure fitted on one side. FIG. 8b shows a converter arrangement with focusing/collimation of the emitted secondary light. In this way, a higher fill factor and sharper contrast can be achieved. In FIG. 8c lenses are arranged on both sides. In the figure, these have the same geometry; needless to say, it is possible for the top and bottom lenses to be made of different materials, e.g. materials that have different refractive indices, and/or different shapes/geometries. The mounting of the micro-lenses can be carried out at the substrate level, wherein only a single component or lens substrate (or a smaller number of components or lens substrates compared to the number of converter regions), which has a curved structure (lens) above and/or below each converter region in a suitable geometry, is bonded with the converter substrate. If the lens substrate is formed of glass, the bonding can take place, for example, by means of anodic bonding. Other processes, such as solder bonding, glass frit bonding, or adhesive bonding are also possible. Alternatively, the lens substrate can also be made of an organic, transparent material, if its temperature stability is sufficient so as not to degrade in subsequent processes. Alternatively, individual converter regions or groups with a smaller number of converter regions can be provided with micro-lenses. Optionally, the supporting element or the substrate can first be separated into chips or smaller converter sections with fewer regions, onto which corresponding lenses are then separately mounted.

Figure 9:
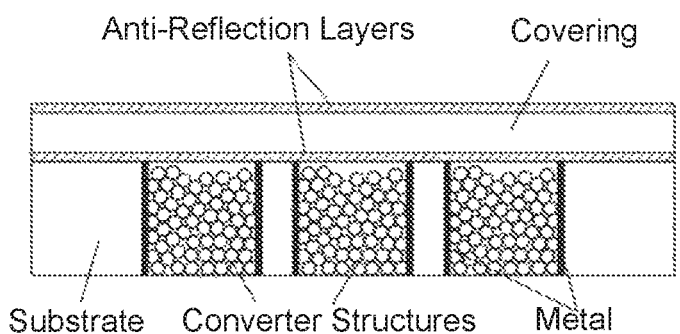
FIG. 9 shows a converter arrangement with a planar covering which has an anti-reflection coating on both sides.

In a further embodiment of the invention, the converter arrangements can be joined with a covering which is preferably provided with an anti-reflection coating on one or both sides. FIG. 9 shows such a converter arrangement with a planar covering, which has an anti-reflection coating on both sides. The planar covering can, for example, be made of glass, or another material that is transparent in the required spectral range and is preferably thermally resistant. In a first variant of this embodiment, the covering is planar. This variant is particularly suitable if, by means of this covering, the anti-reflection coating is to be implemented at the substrate level, i.e., simultaneously and identically for a multiplicity of adjacent arrays. However, one or a plurality of anti-reflection layers can also be deposited on the curved surfaces of previously mounted micro-lenses (see FIG. 8), for example by means of sputtering, vapour deposition, CVD (chemical vapour deposition) or ALD (atomic layer deposition). The micro-lenses in FIG. 8b can also be provided with anti-reflection coatings.

In a specific embodiment of the invention, which can be combined with all the embodiments and embodiments described thus far, different light-converting particles are used to enable multi-colour images. To this end, in a first embodiment, individual regions of the converter are filled with different light-converting particles, wherein only one particle type is located in each region. Several regions in a desired geometry can contain the same particle type. These regions are combined to form groups (arrays), for example, so as to obtain larger areas (e.g. in the form of an arrow, star, or square) that emit identical light. In an alternative embodiment, groups of regions (converter arrays) can be produced which together form only one image point in the finished component. Each region of these arrays contains a different type of particle. This is illustrated schematically in FIG. 10. For the production of such converter arrangements the process sequence shown in FIG. 1 and FIG. 5 can, for example, be repeated multiple times on one and the same substrate. This is achieved by covering regions that have already been filled with a first type of particle and solidified with a mask, before a second, and possibly, for example, third and further operations, is performed, in which second depressions are introduced into the substrate and then, as already shown, filled with a second particle type and solidified. Only when all cavities provided have been formed and filled with solidified particles, the further steps are carried out, such as a partial or complete removal by grinding of the floor-side substrate, and the generation of apertures/pinholes and the like.

Figure 11:
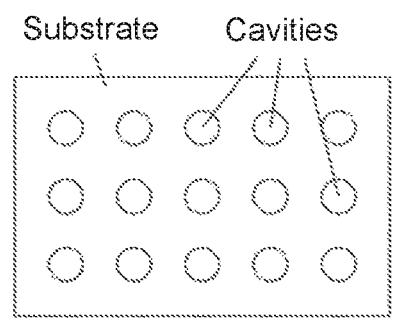
FIG. 11 illustrates a schematic plan view of an array of same light-converting regions of simple geometry.

At the beginning of the description of the invention, the geometry of the regions was explained. It was explained that the regions of a converter structure often have identical dimensions. Further, in particular regions were mainly described whose surface geometries are relatively regular, i.e., having the shape of squares, rectangles, regular polygons, or circles, or the like. A plan view of such a converter structure is shown schematically in FIG. 11. In alternative embodiments, however, this is not the case: The regions of a converter structure need not always have the same size, nor must they always have the same and/or a regular shape.

Figure 12:
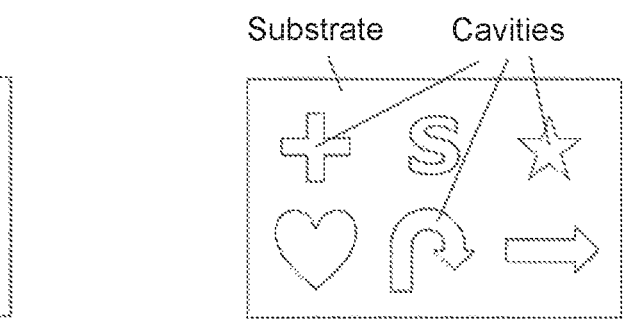
FIG. 12 illustrates such a plan view of an array of light-converting regions that have different shapes, geometries and sizes.

Such an alternative can be used, for example, to balance optical effects. To this end, it can be necessary to vary the pixel size, e.g. from the centre to the edge. In such cases, the regions still have the same surface geometry; however, their surface becomes larger or smaller from the centre of the converter structure toward the edge. Alternatively (or possibly additionally) the surfaces of the regions can have more complex geometries, e.g. can have the form of symbols, letters, numbers or icons. A converter structure with regions of different shapes is shown in FIG. 12. Even if the primary light only partially illuminates such a converter structure, due to the scattering in the individual regions, the secondary light is emitted in accordance with their shapes. In principle, therefore, the surface area of the cavities can have any shape and size.

In further embodiments of the invention, the converter arrangements as described above can be used in many different devices.

Figure 13:
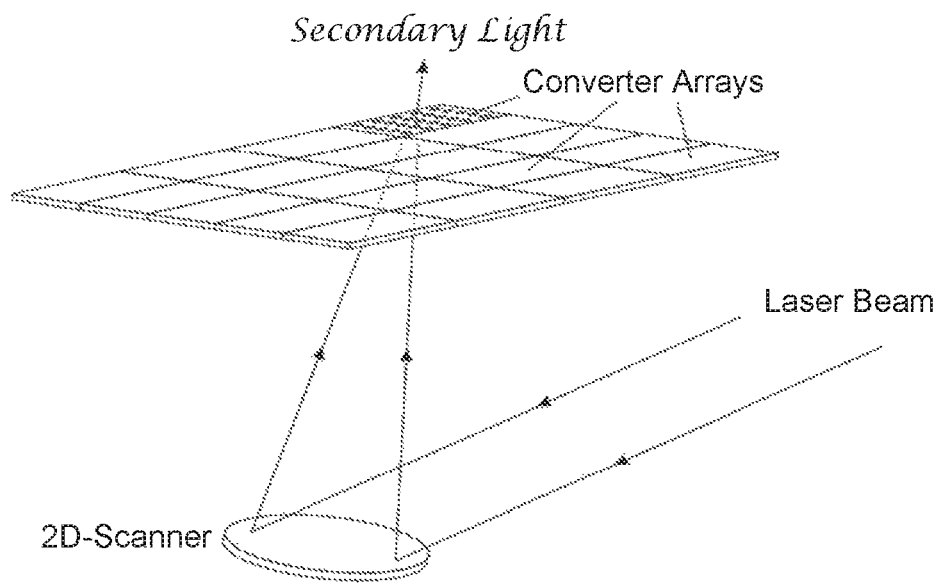
FIG. 13 shows the basic structure of an adaptive light source, a display or an advertising panel using converter arrays of the invention.

In a first variant of these options, converter arrangements with larger arrays of regions filled with light-converting particles are used. Examples of the latter include the use in adaptive headlights and lighting, displays or advertising panels. Large surface area displays and advertising panels based on the remote phosphor technology are already commercially available. An adaptive remote phosphor headlight is described in the above-mentioned document DE 10 2013 226 650 A1. In such devices, the conventional luminescent material faces can be implemented by two-dimensional converter arrays according to the invention with XY pixels, which are mounted above corresponding primary light sources. FIG. 13 shows the basic structure of a display, such as an advertising panel, using a converter array in according to the invention. As shown schematically in the latter, large areas can be achieved by a tile-like sequential arrangement of the individual converter arrays. For modulation of the primary light, for example, a 2D scanner is used. In the case of adaptive headlights, a converter array can be used in which regions filled with light-converting particles are either present in substrate depressions, wherein the primary light radiation and the secondary light emission takes place over the same surface of the converter arrays, as shown schematically in FIG. 3a, or the regions filled with light-converting particles are located in a grid-form support without a floor, and can therefore be illuminated on the rear face with primary light, as shown schematically in FIG. 3b.

Figure 14:
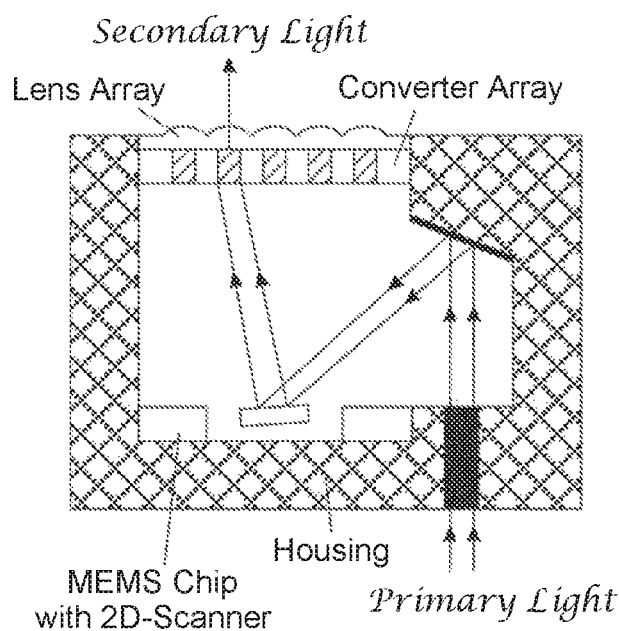
FIG. 14 shows the basic structure of a miniaturised projector using a converter array according to the invention and a MEMS scanner.

In a second variant of the invention, the converter arrangements according to the invention are applied in miniaturised components. A first example of this embodiment of the invention are miniaturised projectors. Since, as stated above, very small regions filled with light-converting particles can be obtained, these can be used as very small pixels that are optically isolated from one another. Thus, a 2D-converter array can be combined with a 2D-MEMS scanner and be combined in a very small space in a housing. An example of this is shown in FIG. 14, in which the basic structure of a miniaturised projector using a converter array according to the invention and a MEMS scanner is reproduced. The projector comprises a housing, which has on one side a through-recess for the coupling-in of primary light. Within the housing, the primary light is directed via a mirror surface onto a moveable mirror whose inclination, or deflection, can be adjusted e.g. piezoelectrically, or electrostatically via electrodes. From this mirror, the light is guided to a further recess in the housing which is sealed by a converter arrangement according to the invention. Light can pass from the moveable mirror through the individual regions of the converter arrangement, where it is converted into secondary light. For purposes of focusing, it is furthermore possible to arrange a lens array over the regions such that the light emitted from each of the regions is suitably focused, or is directed as required by other means. Alternatively, such a lens array can also be arranged on the rear face of the converter structure, i.e., in the interior of the miniaturised projector, as shown schematically in FIG. 15a. In this case, each individual converter structure can be provided with its own lens, but it is also possible to cover a plurality of converter structures by one lens, for example, when the array consists of pixels which each combine a plurality of colours. An anti-reflection coating, as shown in principle in FIG. 16, can alternatively or additionally be integrated. In order to optimise any necessary cooling, the housing of the projector should have good thermal conductivity. It can also be beneficial to keep the lateral frame structures of the light-converting regions as voluminous as possible, which can be achieved, for example, with measures such as are shown in connection with the explanations for FIGS. 4a and 4b. In addition, the frame structures of the converter arrays can be provided on both sides with a particularly good conductive coating. In addition, the housing can be designed so that the heat generated in the converter array is well dissipated via its clamping means.

Further fields of application are microscopy and spectrometry.

For the former, individual point-form light sources, such as produced in accordance with FIG. 7 using an aperture stop, are of interest. A scanner is not required for the introduction of the primary light; this can, for example, take place via a glass fibre or another suitable waveguide. The point light source can also be mounted directly above or in front of the primary light source.

Figure 15:
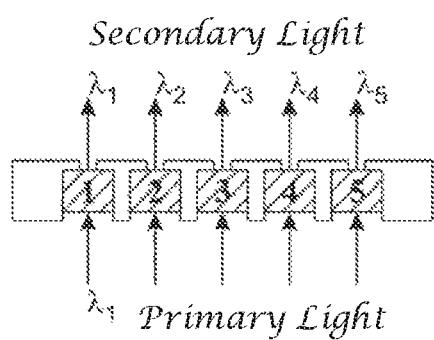
FIG. 15 shows an array of point light sources whose secondary light is in different spectral ranges.

Arrays of individually selectable point light sources, whose secondary light is in each case in a different range of the spectrum that is as narrow-band as possible, can be used in spectrometers. To date, the wavelength in such devices has been selected by means of apertures or filters. This is associated with a considerable loss of intensity since most of the primary light intensity is masked or absorbed. In addition, a mechanism for positioning the aperture and/or selecting the filters is required. With the converter arrangement shown schematically in FIG. 15, which can be incorporated into a miniaturised system as shown in FIG. 14, both aspects can be improved. FIG. 15 shows an array of point light sources whose secondary light is in different spectral ranges. $A_1$-$A_5$ correspond to the wavelengths at the centres of the respective spectral ranges. Insofar as the primary light is not completely converted by the light-converting material, it can be filtered out in the arrangement shown in FIG. 15, such as by means of a planar covering. Such a covering can be designed like the covering shown in FIG. 9. The covering itself can act as a filter, or can support a filter layer.

A system as shown in FIG. 14 can also serve as an adaptive flash. Today the duration and intensity of the flash are already adapted to the lighting conditions during a photographic exposure. It would therefore definitely be of interest to adjust the illumination individually. In one embodiment, the desired illumination can be achieved by an intensity modulation of the primary light controlled synchronously with the deflection of the scanner. In a further embodiment, the desired illumination can be achieved by a targeted periodic modulation of the deflection of the scanner. Both methods can also be combined. With a sufficiently high scanning speed of the scanner and a sufficiently high light output of the secondary light, a scene to be photographed can in this way be illuminated for an exposure in fractions of a second.

Figure 16:
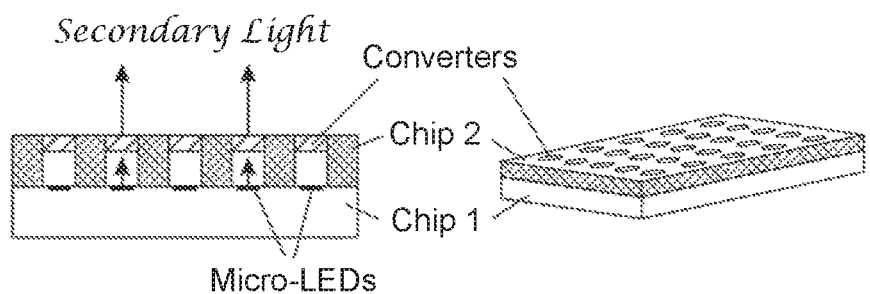
FIG. 16 is a schematic 3D-view and a cross-section through a coloured micro-display.

In further variants of converter arrangements according to the invention applied in miniaturised optoelectronic components, the converter arrangements are combined with micro-LED arrays instead of 1D- or 2D-scanners. The advantage is that such systems require no moving parts, require neither a light source or complex optics, and can be further miniaturised. Micro-LED arrays are of great interest for optical communication, for miniaturised displays, such as for data glasses or "wearable computers", or for maskfree photolithography. J. J. D. McKendry et. al. in "Visiblelight communications using a CMOS-controlled microlight-emitting diode array", J. Lightwave Technol., Vol. 30, No. 1, 2012, have produced an array of 10×10 LEDs with a pitch (step dimension) of 100 μm and a pixel diameter of 45 μm in an InGaN epitaxial layer on a silicon substrate. W. C. Chong et. al., "1700 pixels per inch (PPI) passive-matrix micro-LED display powered by ASIC", Proc. CSICs, La Jolla, Calif., 2014, describes an LED array with 256×192 separately controllable pixels, only 15×15 μm² in size, that is integrated with a driver chip by means of flip-chip bonding. However, within an array these miniaturised LEDs all emit in one colour that is predetermined by the semiconductor material used. For the production of coloured (RGB) micro-displays, therefore, converters are required. However, pixel dimensions of a few 10 μm cannot be realized using known techniques. With converters in accordance with the invention, however, this is possible. FIG. 16 shows a schematic 3D-view and a cross section through a coloured micro-display consisting of a chip 1 with a micro-LED array and a chip 2 applied there above with converter structures which are designed as an array of closely spaced lightconverting regions that are adjusted in size, shape and step dimensions to the micro-LED array. The connection between such a chip 2 comprising the converter structures and a chip 1 comprising a micro-LED array can be effected on a chip or substrate level (wafer level) using known techniques, such as adhering or bonding.

Figure 17:
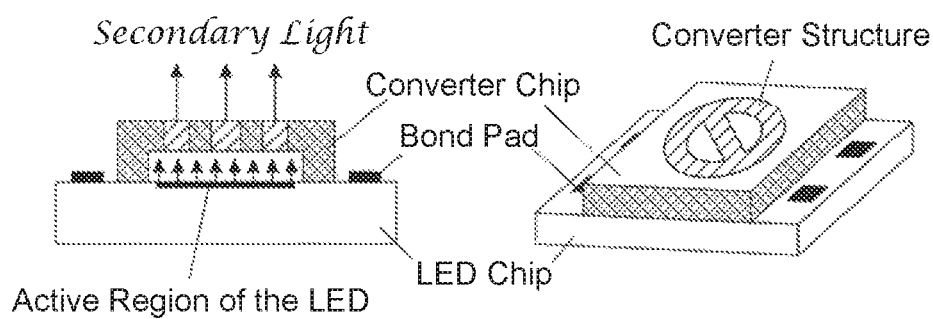
FIG. 17 is a schematic 3D-view and a cross-section through an arrangement consisting of a single LED chip and a chip with a complex converter structure arranged on top thereof.

Instead of arrays, it is also possible to combine individual LEDs, conventional components or micro-LEDs with converter arrangements, wherein their individual structures, in contrast to the system shown in FIG. 16, preferably should illuminate all elements at the same time so as form images, e.g. short phrases, number sequences, or icons. FIG. 17 shows in a schematic 3D-view and in cross-section, an embodiment based on a conventional LED chip which can be contacted by wire bonding.

This is a component consisting of a base chip having an LED light-emitting area and a converter structure according to the invention designed as a cover chip.

The invention claimed is:

1. A converter arrangement for the conversion of a primary light into a secondary light, the converter arrangement comprising:
   at least one body having a light-converting structure with open pores, said pores being filled with gas or evacuated, or at least partially filled with an organic material other than a material of said light-converting structure;
   a frame laterally holding said at least one body, said frame having inner faces;
   a transparent layer that is devoid of organic components, said transparent layer covering surfaces of said lightconverting structure and said inner faces of said frame such that said at least one body forms a region in which a property of an incident light is altered.

2. The converter arrangement according to claim 1, further comprising a substrate supporting said at least one body resting thereon, said substrate also forming a frame structure of said frame.

3. The converter arrangement according to claim 2, which comprises a metallic mirror layer formed on a surface of said substrate on which said at least one body rests.

4. The converter arrangement according to claim 2, wherein said substrate, in a region in which said at least one body rests, is formed with a through-opening enabling the primary light to be coupled therethrough and into said at least one body.

5. The converter arrangement according to claim 1, wherein said at least one body comprises a lower face subject to irradiation with the primary light and an upper face for emitting the secondary light.

6. The converter arrangement according to claim 5, wherein a bottom face of said at least one body is partially covered with a metallic mirror layer, and said metallic mirror layer is formed with a central pinhole aperture at which said at least one body remains uncovered.

7. The converter arrangement according to claim 5, further comprising at least one of a focusing or collimation device disposed below or above a part of the region wherein the property of the incident light is altered, at least one of said focusing or collimation device consisting of individual lenses or a lens structure that extends over the converter arrangement, such that an element of said lens structure is located at least one of below or above the region, said element having a curved surface on an outer face, and wherein the lens structure is formed with an anti-reflection coating on one or both sides thereof.

8. The converter arrangement according to claim 1, wherein said at least one body is one of a multitude of bodies, and wherein individual said bodies are separated from one another by surrounding frames.

9. The converter arrangement according to claim 8, wherein at least one of the following is true: an upper face of each of said bodies has a surface of between 100 μm² and 0.25 mm² or each of said bodies has a depth of between 50 and 500 μm.

10. The converter arrangement according to claim 1, wherein a depth of said at least one body is greater than a maximum diameter of a surface thereof.

11. The converter arrangement according to claim 1, wherein said at least one body is one of a multitude of bodies, and wherein a surface area of the upper face of individual said bodies becomes larger or smaller towards an edge of the converter arrangement, while a geometric shape of the upper face remains the same in each case.

12. The converter arrangement according to claim 1, wherein said at least one body is one of a multitude of bodies, and wherein a geometric shape of an upper face of each of the said bodies varies.

13. The converter arrangement according to claim 1, wherein said at least one body is one of a multitude of bodies, and wherein said light-converting structure of each body is formed of loosely filled-in particles that are bonded together by said transparent layer.

14. The converter arrangement according to claim 13, wherein said particles consist exclusively of inorganic material.

15. The converter arrangement according to claim 13, wherein all particles of each said light-converting structure consist of a light-converting material, and wherein all particles consist of the same light-converting material, or a first fraction of said particles consist of a first light-converting material and a second fraction of said particles consist of a second light-converting material.

16. The converter arrangement according to claim 13, wherein a first fraction of the particles consist of a light-converting material and a second fraction of the particles consist of a non-light-converting, optically transparent material.

17. The converter arrangement according to claim 13, wherein said particles have an average diameter in a range from 1 to 50 μm.

18. The converter arrangement according to claim 13, wherein a thickness of said transparent layer amounts to 0.5% to 50% of a diameter of said particles.

19. The converter arrangement according to claim 1, wherein said transparent layer is a layer of an inorganic material being a metal compound selected from the group consisting of a metal oxide, a metal nitride, and a metal oxynitride of a metal or a mixture of a plurality of metals, and having anti-reflective properties.

20. The converter arrangement according to claim 19, wherein said transparent layer of inorganic material has a thickness in the range from 5 nm to 5 μm.

21. The converter arrangement according to claim 1, wherein said inner faces of said frame are formed with a metallic mirror layer.

22. The converter arrangement according to claim 1, wherein lateral frames of said at least one body are vertical or inclined.

23. The converter arrangement according to claim 1, wherein the region in which the property of the incident light is altered is provided with a planar covering, and wherein the covering is formed with an anti-reflection layer on one or both sides thereof.

24. The converter arrangement according to claim 1, wherein said region is one of a multitude of regions, wherein a first group of said regions is filled with a first type of light-converting particles, and a second group of regions is filled with a second type of light-converting particles, wherein regions with the same type of light-converting particles in desired sections of the converter arrangement are respectively combined to form arrays which emit identical light.

25. The converter arrangement according to claim 1, wherein said at least one body is one of a multitude of bodies and said region is one of a multitude of regions, and wherein two or more adjacent said regions respectively contain different types of light-converting particles and are combined to form an array which is provided for the generation of a single image point.

26. A display arrangement, comprising:
a light source selected from the group consisting of a mirror, a 2D-scanner and a point light source,
at least one converter arrangement according to claim 1 disposed such that light emitted by said light source is guided through said converter arrangement and converted therein into a secondary light.

27. A miniaturized component, comprising:
a substrate with at least one primary light source;
a converter arrangement according to claim 1 disposed on said substrate, said converter arrangement having a lower face subject to irradiation with the primary light and an upper face for emitting the secondary light, said frame of said converter arrangement on said substrate surrounding said at least one primary light source such that the light of said at least one primary light source is guided through said at least one body of said converter arrangement.

28. A miniaturised component, comprising:
a substrate having at least one primary light source;
a housing disposed to cover said primary light source spaced apart therefrom; and
a converter arrangement according to claim 1 integrated into said housing opposite said at least one primary light source.

29. A method for producing a converter arrangement, the method comprising:
(a) providing a planar substrate;
(b) forming at least one cavity in a surface of the substrate;
(c) filling particles with light-converting properties into the at least one cavity;
(d) depositing a transparent inorganic layer onto the particles and inner faces of a frame forming the cavity by using a chemical vapor deposition (CVD) process; and
(e) removing the substrate below the converter arrangement,
to thereby produce a converter arrangement according to claim 1.

* * * * *

UNITED STATES PATENT AND TRADEMARK OFFICE
CERTIFICATE OF CORRECTION

PATENT NO. : 10,647,915 B2
APPLICATION NO. : 16/063606
DATED : May 12, 2020
INVENTOR(S) : Ulrich Hofmann et al.

It is certified that error appears in the above-identified patent and that said Letters Patent is hereby corrected as shown below:

In the Specification

Figure 1B:
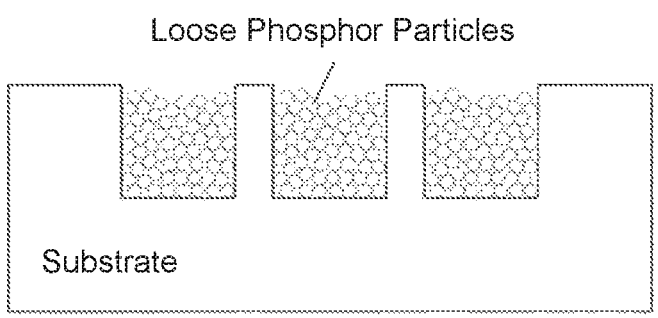
Figure 1C:
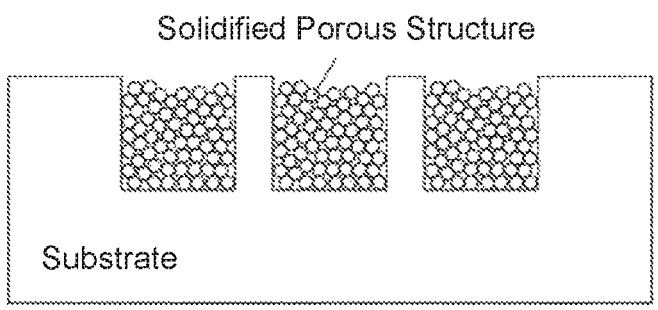

In the section BRIEF DESCRIPTION OF THE SEVERAL VIEWS OF THE DRAWINGS,
Column 4, Lines 60-64 should read the following:
The invention is described in more detail below, inter alia with the aid of figures, which show the following:
FIG. 1A, FIG. 1B and FIG. 1C illustrate schematically a possible production of converters (substrate-supported) according to the present invention, Column 5, Lines 3-8 should read the following:
FIG. 3A and FIG. 3B shows the possibilities for the coupling of primary light into a converter arrangement according to the present invention,
FIG. 4A and FIG. 4B shows a converter in accordance with the invention, in which the substrate beneath the porous light-converting bodies has been removed, Column 5, Lines 14-20 should read the following:
FIG. 6A and FIG. 6B shows two possible converter arrangements with aperture stops ("pinholes"), which can serve as miniaturised point light sources,
FIG. 7A and FIG. 7B two converter arrangements with inclined side faces are shown, in FIG. 7A with pinholes and metallization on the insides of the cavities, and in FIG. 7B only with metallised side faces, Column 12, Line 31 should read the following:
primary light irradiated from the front face.

Column 16, Lines 31 should read the following:
projector, as shown schematically in FIG. 8A. In this case, Column 16, Line 37 should read the following:
FIG. 9, can alternatively or additionally be integrated. In Signed and Sealed this
Twenty-second Day of December, 2020

Andrei Iancu
*Director of the United States Patent and Trademark Office*